AUTOMATIC GAIN CONTROL SYSTEM USING SIGNAL SUPPRESSION
Filed April 20, 1961
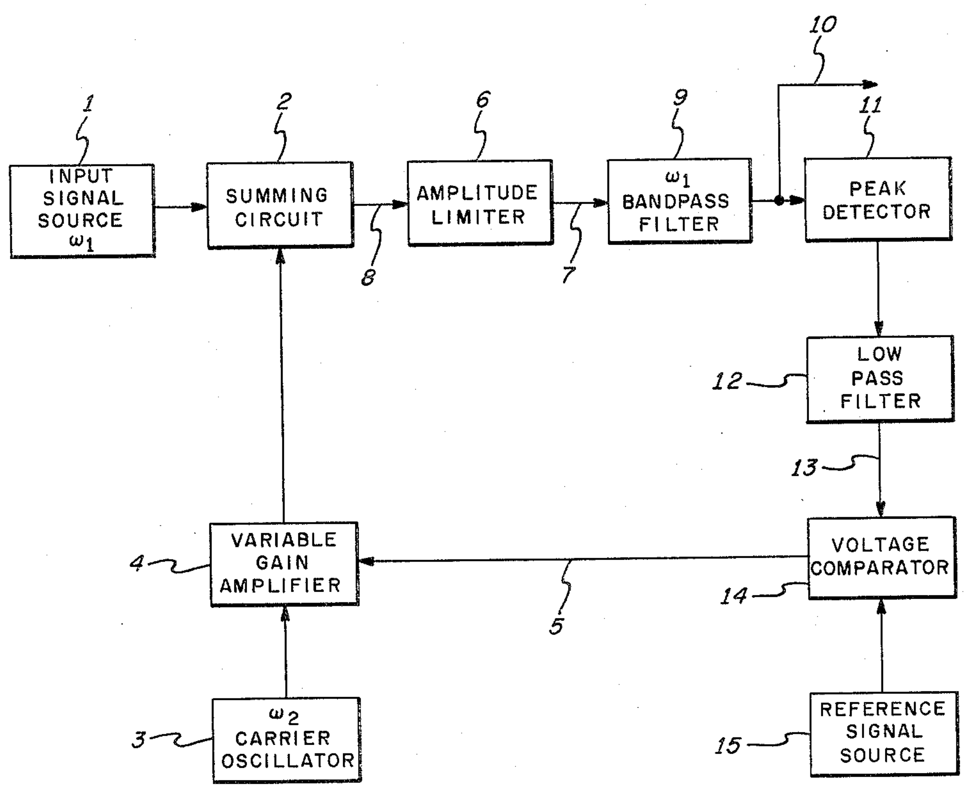
INVENTORS
STANLEY E. BOGOTCH
CHARLES E. COOK
BY
[signature]
ATTORNEY 3,162,801

AUTOMATIC GAIN CONTROL SYSTEM USING SIGNAL SUPPRESSION

Stanley E. Bogotch, Forest Hills, and Charles E. Cook, Farmingdale, N.Y., assignors to Sperry Rand Corporation, Great Neck, N.Y., a corporation of Delaware Filed Apr. 20, 1961, Ser. No. 104,372
7 Claims. (Cl. 323—66)

The present invention generally relates to automatic gain control systems and, more particularly, to an automatic gain control system wherein the amplitude of a weaker signal having a first carrier frequency is automatically controlled in accordance with the amplitude of a stronger signal having a second carrier frequency.

Conventional automatic gain control systems generally contemplate the use of amplifiers having a linear signal transfer characteristic wherein the slope of said characteristic (gain factor) is adjusted in accordance with the amplitude of a control signal. In a typical case, the automatic gain control system includes a plurality of vacuum tube amplifying stages connected in cascade. Provision is made for the application of a gain control signal to the grids of the respective vacuum tubes. In addition to providing the desired gain control action, the application of the control signal also results in a change of the Miller effect capacitance of the individual tubes. The variation in capacitance, in turn, effects a change in the phase shift versus frequency characteristic of the gain controlled amplifier.

Ordinarily, changes in the phase shift characteristic of the controlled amplifier consequent to the application of the gain control signal is of no concern. This is particularly true in ordinary AM receivers which are intrinsically insensitive to phase modulation of the received signal. However, the need for avoiding unintentional or undesired phase modulation is self-evident in the case of gain controlled receivers designed to respond in accordance with the phase modulation of a desired signal.

It is the principal object of the present invention to provide a system for automatically controlling the amplitude of an applied signal without effecting the phase of the applied signal.

Another object is to provide an automatic gain control system wherein the amplitude of a weaker signal is controlled in accordance with the amplitude of a stronger signal.

A further object is to provide a system for controlling the amplitude of an input signal having a first carrier frequency in accordance with the amplitude of a control signal having a second carrier frequency.

An additional object is to provide an automatic gain control system utilizing the phenomenon of weak signal suppression in a signal processing circuit having a nonlinear transfer characteristic.

These and other objects of the present invention, as will appear from a reading of the following specification, are accomplished in a preferred embodiment by the provision of a signal summing circuit for combining an input signal and a controllable amplitude locally generated signal. The input signal, whose amplitude is to be controlled in a predetermined manner, is at a first carrier frequency. The locally generated signal, which is used to control the amplitude of the input signal, is at a second carrier frequency. The combined input and locally generated signals are applied to a hard limiter having a limiting threshold below the amplitude of the locally generated signal but above the amplitude of the input signal. The amplitude of the input signal is suppressed in the hard limiter in accordance with the ratio of the amplitude of the locally generated signal to the limiting threshold of the hard limiter. The frequency and phase characteristics of the suppressed input signal are preserved.

The suppressed input signal at the output of the hard limiter is extracted by means of a bandpass filter to the exclusion of signals at other frequencies including the locally generated signal. The signal passed by the filter is then detected and compared in amplitude with a reference signal representing a desired level to which the original applied input signal is to be controlled. The comparison produces an error signal representing the magnitude and sense of the deviation of the input signal from the predetermined level represented by the reference signal. The error signal is applied to the source of the locally generated signal to control the amplitude of the locally generated signal in accordance therewith.

For a more complete understanding of the present invention, reference should be had to the following specification and to the sole figure which is a simplified block diagram of the preferred embodiment.

A source of input signal whose amplitude is to be controlled in a predetermined manner is generally represented by the numeral 1. The input signal is applied to a first input of summing circuit 2. The frequency of the input signal is represented by $\omega_1$. Carrier oscillator 3 produces a continuous alternating signal at a different carrier frequency designated $\omega_2$. The locally generated signal is applied via variable gain amplifier 4 to a second input of summing circuit 2. Variable gain amplifier 4 is adapted to vary the amplitude of the locally generated signal in accordance with a control signal applied by lead 5. Other arrangements for producing a controllable amplitude locally generated signal will be obvious to those skilled in the art. The use of a variable gain amplifier is merely illustrative. Circuit 2 may be a conventional linear resistive signal summation circuit for additively combining the input signal of source 1 and the controlled amplitude locally generated signal of oscillator 3. The combined signals are applied to a signal processing circuit or amplitude limiter 6.

In accordance with the present invention, the signal transfer characteristic of limiter 6 is such that the level of the output signal on lead 7 increases nonlinearly toward a maximum limiting value in response to signals of increasing amplitude on lead 8. It is not required that the transfer characteristic of limiter 6 be nonlinear for all amplitude values of the signals applied via lead 8. It is only necessary that the nonlinear characteristic obtain over a predetermined amplitude range and that the amplitude of the locally generated signals at the output of amplifier 4 be maintained within said predetermined amplitude range. Preferably, the nonlinear characteristic of limiter 6 is such that there is no appreciable increase in output signal level in response to input signal levels in excess of a predetermined value. In the preferred case, the amplitude of the locally generated signal at the output of amplifier 4 is maintained above said predetermined value.

It can be shown that when a weaker amplitude signal and a stronger amplitude signal are simultaneously applied in the described manner to amplitude limiter 6, the amplitude of the weaker signal at the output of the limiter varies in accordance with the amplitude of the stronger signal. This phenomenon in one form is recognized in the prior art as the signal suppression effect that occurs in the process of amplitude detecting a weak signal in the presence of noise where the signal to noise ratio is of the order of one or less. This ordinarily undesired phenomenon is exploited to advantage by the present invention in achieving automatic gain control of the weaker signal. An important feature of the invention is that only the amplitude characteristic of the weaker signal is affected. The phase of the weaker signal is not disturbed.

The frequency $\omega_2$ of the locally generated signal is preselected relative to the frequency $\omega_1$ of the input signal so that the cross modulation products resulting from the simultaneous application of the two signals to limiter 6 are at frequencies outside the frequency spectrum of the weaker signal. The spectrum of frequencies comprising the weaker signal are selectively passed by bandpass filter 9 which is coupled to the output of limiter 6. Filter 9 rejects the locally generated signal at frequency $\omega_2$ as well as the aforementioned cross modulation product signals.

The signal passed by filter 9 is substantially identical to the input signal of source 1 in terms of phase and frequency characteristics. It differs from the input signal only in that the amplitude of the signal at the output of filter 9 has been regulated in accordance with the amplitude of the locally generated signal at the output of amplifier 4. The regulated signal is made available on output lead 10 and is also applied to peak detector 11.

Low-pass filter 12, connected to the output of peak detector 11 coacts with detector 11 in a conventional manner to produce an output signal on lead 13 having an amplitude related to the average carrier amplitude of the signal at the output of filter 9. In general, any other demodulator producing an output signal related to the amplitude of the signal passed by filter 9 may be substituted for peak detector 11 and low pass filter 12. The output signal is applied to a first input of voltage comparator 14. Comparator 14 receives a second input signal from reference signal source 15. The amplitude of the reference signal produced by source 15 is of a fixed value representing the predetermined level at which the controlled signal on output lead 10 is maintained. Comparator 14 produces an error signal representing the deviation, if any, of the controlled signal from the predetermined level represented by the reference signal. As previously stated, the error signal is applied via lead 5 to control the gain of amplifier 4 and, consequently, the amplitude of the locally generated signal of source 3 as applied to summing circuit 2.

Although a hard limiter is preferred for use as amplitude limiter 6, acceptable regulatory action can be achieved by the use of other processing circuits having less abrupt signal transfer characteristics. For example, gain control action through the suppression of the weaker signal of source 1 by the stronger locally generated signal of source 3 can be achieved by using a logarithmic amplifier, a diode detector, a travelling wave tube (where $\omega_1$ and $\omega_2$ are microwave frequencies) or any other circuit device having a signal transfer characteristic which increases in a non-linear manner toward a maximum limiting value for increasing amplitudes of input signals.

While the invention has been described in its preferred embodiment, it is understood that the words which have been used are words of description rather than of limitation and that changes within the purview of the appended claims may be made without departing from the true scope and spirit of the invention in its broader aspects.

What is claimed is:

1. An automatic gain control system for regulating the gain of an input signal having a first carrier frequency, said system comprising a controllable source of variable amplitude signal having a second carrier frequency, the amplitude of said variable amplitude signal being greater than the amplitude of said input signal, a signal processing circuit having a signal transfer characteristic such that the amplitudes of signals at the output of said circuit increase nonlinearly toward a maximum limiting value in response to signals of increasing amplitude applied to the input of said circuit, means for applying said signals having said first and second carrier frequencies to said input of said circuit, a bandpass filter coupled to said output of said circuit, said filter passing signals having said first carrier frequency and rejecting signals having said second carrier frequency, a source of reference signal, means including demodulating means connected to the output of said filter and to said source of reference signals for producing an error signal representing the difference between the amplitudes of the signals passed by said filter and said reference signal, and means for applying said error signal to said controllable source for varying the amplitude of said signal having said second carrier frequency.

2. An automatic gain control system for regulating the gain of an input signal having a first carrier frequency, said system comprising a controllable source of variable amplitude signal having a second carrier frequency, the amplitude of said variable amplitude signal being greater than the amplitude of said input signal, a signal processing circuit having a signal transfer characteristic such that the amplitudes of signals at the output of said circuit increase nonlinearly toward a maximum limiting value in response to signals of increasing amplitude applied to the input of said circuit, means for applying said signals having said first and second carrier frequencies to said input of said circuit, a bandpass filter coupled to said output of said circuit, said filter passing signals having said first carrier frequency and rejecting signals having said second carrier frequency, demodulating means connected to the output of said filter for producing an output signal related to the amplitude of the signal passed by said filter, a source of reference signal, means connected to receive said output signal and said reference signal for producing an error signal representing the difference between the amplitudes of said output signal and said reference signal, and means for applying said error signal to said controllable source for varying the amplitude of said signal having said second carrier frequency.

3. An automatic gain control system for regulating the gain of an input signal having a first carrier frequency, said system comprising a controllable source of variable amplitude alternating signal having a second carrier frequency, the amplitude of said variable amplitude signal being greater than the amplitude of said input signal, an amplitude limiter, means for applying said input signal and said alternating signal to said limiter, a bandpass filter coupled to the output of said limiter, said filter passing signals having said first carrier frequency and rejecting signals having said second carrier frequency, a source of reference signal, means including demodulating means connected to the output of said filter and to said source of reference signal for producing an error signal representing the difference between the amplitudes of the signals passed by said filter and said reference signal, and means for applying said error signal to said controllable source for varying the amplitude of said alternating signal.

4. An automatic gain control system for regulating the gain of an input signal having a first carrier frequency, said system comprising a controllable source of variable amplitude alternating signal having a second carrier frequency, a hard limiter having a nonlinear signal transfer characteristic such that there is no appreciable increase in signal level at its output in response to signal levels at its input in excess of a predetermined value, the amplitude of said signal having said second carrier frequency being greater than said predetermined value and the amplitude of said input signal being less than said predetermined value, means for applying said signals having said first and second carrier frequencies to said input of said limiter, a bandpass filter coupled to said output of said limiter, said filter passing signals having said first carrier frequency and rejecting signals having said second carrier frequency, demodulating means connected to the output of said filter for producing an output signal related to the amplitude of the signal passed by said filter, a source of reference signal, means connected to receive said output signal and said reference signal for producing an error signal representing the difference between the amplitudes of said output signal and said reference signal, and means for applying said error signal to said controllable source for varying the amplitude of said alternating signal.

5. An automatic gain control system for regulating the gain of an input signal having a first carrier frequency, said system comprising a source of alternating signal having a second carrier frequency, the amplitude of said alternating signal being greater than the amplitude of said input signal, a signal summing circuit having two input terminals, variable gain amplifier means for applying said alternating signal to a first input terminal of said summing circuit, said input signal being applied to the other of said input terminals, an amplitude limiter coupled to the output of said summing circuit, a bandpass filter coupled to the output of said limiter, said filter passing signals having said first carrier frequency and rejecting signals having said second carrier frequency, means connected to the output of said filter for producing an output signal related to the average carrier amplitude of the signal passed by said filter, a source of reference signal, means connected to receive said output signal and said reference signal for producing an error signal representing the difference between the amplitudes of said output signal and said reference signal, and means for applying said error signal to said variable gain amplifier means for varying the amplitude of said alternating signal.

6. An automatic gain control system for regulating the gain of an input signal having a first carrier frequency, said system comprising a source of alternating signal having a second carrier frequency, a signal summing circuit having two input terminals, variable gain amplifier means for applying said alternating signal to a first input terminal of said summing circuit, said input signal being applied to the other of said input terminals, an amplitude limiter having a signal limiting threshold value, the amplitude of said input signal being below said value and the amplitude of said alternating signal being above said value, said limiter being coupled to the output of said summing circuit, a bandpass filter coupled to the output of said limiter, said filter passing signals having said first carrier frequency and rejecting signals having said second carrier frequency, means connected to the output of said filter for producing an output signal related to the average carrier amplitude of the signal passed by said filter, a source of reference signal, and a signal comparator, said output signal and said reference signal being applied to said signal comparator to produce an error signal representing the difference between the amplitudes of said output signal and said reference signal, said error signal being applied to said variable gain amplifier means to control the gain thereof.

7. An automatic gain control system for regulating the gain of an input signal having a first carrier frequency, said system comprising a controllable source of variable amplitude alternating signal having a second carrier frequency, the amplitude of said variable amplitude signal being greater than the amplitude of said input signal, an amplitude limiter, means for applying said input signal and said alternating signal to said limiter, a bandpass filter coupled to the output of said limiter, said filter passing signals having said first carrier frequency and rejecting signals having said second carrier frequency, a source of reference signal, a signal comparator having two inputs, said reference signal being applied to a first input of said comparator, a peak detector and a low-pass filter connected in cascade for coupling the output of said filter to the other input of said comparator, said comparator producing an error signal representing the amplitude difference between the signals applied to the two inputs thereof, and means for applying said error signal to said controllable source for varying the amplitude of said alternating signal.

References Cited by the Examiner

UNITED STATES PATENTS

| | | | |
|---|---|---|---|
| 2,613,346 | 10/52 | Robinson | 323—66 |
| 2,866,151 | 12/58 | Applin et al. | 323—66 X |
| 2,967,992 | 1/61 | Scholten | 323—66 |

LLOYD McCOLLUM, *Primary Examiner.*

MILTON O. HIRSHFIELD, *Examiner.*